United States Patent
Kim et al.

(10) Patent No.: US 9,099,203 B2
(45) Date of Patent: Aug. 4, 2015

(54) METHOD FOR TESTING RETENTION CHARACTERISTICS OF SEMICONDUCTOR DEVICE HAVING A VOLATILE DEVICE CELL AND SEMICONDUCTOR TEST APPARATUS

(71) Applicants: Chiho Kim, Pyeongtaek-si (KR); Zhiliang Xia, Hwaseong-si (KR); Sung Hee Lee, Osan-si (KR); Nara Kim, Seongnam-si (KR); Dae Sin Kim, Hwaseong-si (KR)

(72) Inventors: Chiho Kim, Pyeongtaek-si (KR); Zhiliang Xia, Hwaseong-si (KR); Sung Hee Lee, Osan-si (KR); Nara Kim, Seongnam-si (KR); Dae Sin Kim, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/060,808

(22) Filed: Oct. 23, 2013

(65) Prior Publication Data
US 2014/0133254 A1    May 15, 2014

(30) Foreign Application Priority Data
Nov. 12, 2012  (KR) .................. 10-2012-0127567

(51) Int. Cl.
*G11C 7/00*  (2006.01)
*G11C 29/50*  (2006.01)
*G11C 29/56*  (2006.01)
*G11C 11/40*  (2006.01)

(52) U.S. Cl.
CPC .......... *G11C 29/50016* (2013.01); *G11C 29/56* (2013.01); *G11C 11/40* (2013.01); *G11C 29/50* (2013.01)

(58) Field of Classification Search
CPC ................................. G11C 29/50; G11C 29/02
USPC ................................. 365/201, 230.04, 189.11
See application file for complete search history.

(56) References Cited

U.S. PATENT DOCUMENTS

| | | | |
|---|---|---|---|
| 5,852,581 A * | 12/1998 | Beffa et al. | 365/201 |
| 7,120,073 B2 | 10/2006 | Meyer et al. | |
| 7,313,033 B2 * | 12/2007 | Fuhrmann et al. | 365/189.09 |
| 2006/0038169 A1 | 2/2006 | Mandell et al. | |
| 2006/0044900 A1 * | 3/2006 | Versen | 365/201 |
| 2010/0302888 A1 | 12/2010 | Mori et al. | |
| 2011/0138251 A1 | 6/2011 | Pawlowski | |

FOREIGN PATENT DOCUMENTS

| | | |
|---|---|---|
| JP | 2011029404 A | 2/2011 |
| JP | 2011227969 A | 11/2011 |
| KR | 20050062059 A | 6/2005 |
| KR | 20060084101 A | 7/2006 |
| KR | 20060097565 A | 9/2006 |

* cited by examiner

*Primary Examiner* — Connie Yoha
(74) *Attorney, Agent, or Firm* — Harness, Dickey & Pierce, P.L.C.

(57) ABSTRACT

A test method of a semiconductor device and a semiconductor test apparatus. The test method includes providing a semiconductor device including a substrate having an active region and an isolation region, a volatile device cell including a gate insulation layer and a gate on the active region, a junction region in the active region, a capacitor connected to the junction region, and a passing gate on the isolation region, providing a first test voltage to the gate and a second test voltage greater than the first test voltage to the passing gate to deteriorate interfacial defects of the gate insulation layer, and measuring retention characteristics of the volatile device cell.

26 Claims, 12 Drawing Sheets

METHOD FOR TESTING RETENTION CHARACTERISTICS OF SEMICONDUCTOR DEVICE HAVING A VOLATILE DEVICE CELL AND SEMICONDUCTOR TEST APPARATUS

CROSS-REFERENCE TO RELATED APPLICATION

This application claims priority from Korean Patent Application No. 10-2012-0127567 filed on Nov. 12, 2012 in the Korean Intellectual Property Office, and all the benefits accruing therefrom under 35 U.S.C. 119, the contents of which in its entirety are herein incorporated by reference.

BACKGROUND

1. Field of the Inventive Concept

Example embodiments of inventive concepts relate to a test method of a semiconductor device and/or a semiconductor test apparatus.

2. Description of the Related Art

A dynamic random access memory (DRAM) cell includes a capacitor for storing charges and a transistor to access the capacitor. The charges (i.e., data) stored in the capacitor may be lost with the lapse of time.

A VRT cell is a cell whose data retention time (i.e. charge retention time) is not constant. In the related art, a VRT cell is detected by writing data to a DRAM cell and testing multiple times if data is lost or not after a specific period of time has passed. Even if the DRAM cell is determined to be a normal cell in the first test cycle, it may be determined to be a defective cell due to data loss in the second test cycle. After repeatedly performing tests, the DRAM cell exhibiting changed test results is determined to be a VRT cell.

However, since the data retention time of the VRT cell is not constant, as described above, even if the DRAM cell is determined to be a normal cell in the two test cycles, it may be determined to be a defective cell in a third test cycle.

Therefore, according to the related art test method, it is difficult to eliminate all VRT cells whose data retention time varies. In addition, since multiple test repetitions are performed to obtain an optimum value of the number of test repetitions, a test time may be undesirably prolonged.

SUMMARY

Some example embodiments of inventive concepts provide a test method of a semiconductor device that can determine a VRT cell within a short test time.

Some example embodiments of inventive concepts provide a semiconductor test apparatus that can determine a VRT cell within a short test time.

In one example embodiment, the test method includes providing a semiconductor device having a substrate including an active region and an isolation region, a volatile device cell including a gate insulation layer and a gate on the active region, a junction region in the active region, a capacitor connected to the junction region, and a passing gate formed on the isolation region, providing a first test voltage to the gate and a second test voltage greater than the first test voltage to the passing gate to deteriorate interfacial defects of the gate insulation layer, and measuring retention characteristics of the volatile device cell.

In one example embodiment, the test method includes providing a semiconductor device including a plurality of word lines, each connected to one or more volatile device cell, providing a first test voltage to a first word line among the plurality of word lines and providing a second test voltage greater than the first test voltage to a second word line among the plurality of word lines, the second word line being directly next to the first word line to deteriorate a defect associated with data retention of a volatile device cell connected to the first word line, and measuring one or more retention characteristics of the volatile device cell connected to the first word line.

In one example embodiment, a semiconductor test apparatus includes a support configured to hold a semiconductor device having a substrate including an active region and an isolation region, a volatile device cell including a gate insulation layer and a gate formed in the active region, a junction region in the active region, a capacitor connected to the junction region, and a passing gate formed in the isolation region, a test voltage generator configured to provide a first test voltage to the gate and a second test voltage greater than the first test voltage to the passing gate to deteriorate interfacial defects of the gate insulation layer, and a measurer configured to measure retention characteristics of the volatile device cell.

In one example embodiment, applying a first voltage to a first gate of a volatile device cell, the volatile device cell in an active region of a substrate in the semiconductor device and including a gate insulation layer and the first gate, the substrate including the active region and an isolation region, a junction region on the active region and a capacitor connected to the junction region; applying a second voltage to a passing gate in the isolation region of the substrate, the first voltage being less than the second voltage; and measuring retention characteristics of the volatile device cell.

BRIEF DESCRIPTION OF THE DRAWINGS

The above and other features and advantages of example embodiments of inventive concepts will become more apparent by describing in detail preferred example embodiments thereof with reference to the attached drawings in which.

DETAILED DESCRIPTION OF THE EMBODIMENTS

Advantages and features of inventive concepts and/or methods of accomplishing the same may be understood more readily by reference to the following detailed description of some example embodiments and the accompanying drawings. Example embodiments of inventive concepts may, however, be embodied in many different forms and should not be construed as being limited to the example embodiments set forth herein. Rather, these embodiments are provided so that this disclosure will be thorough and complete and will fully convey the concept of example embodiments of inventive concepts to those skilled in the art, and the present example embodiments will only be defined by the appended claims. It will be understood that when an element or layer is referred to as being "on", "connected to" or "coupled to" another element, it can be directly on, connected or coupled to the other element or intervening elements may be present.

For example, it will be understood that when it is said that an element "transmits or outputs" data or a signal to another element, the element may directly "transmit or output" the data or the signal to the other element, or may "transmit or output" the data or the signal to the other element through at least one or another element.

As used herein, the term "and/or" includes any and all combinations of one or more of the associated listed items.

In the following example embodiments, an example volatile device cell is directed to a dynamic random access memory (DRAM) cell, but example embodiments are not limited thereto. The example volatile device cell may be a static random access memory (SRAM) cell.

Hereinafter, a test method of a semiconductor device according to an example embodiment of concepts will be described with reference to FIGS. 1 to 5.

Figure 1:
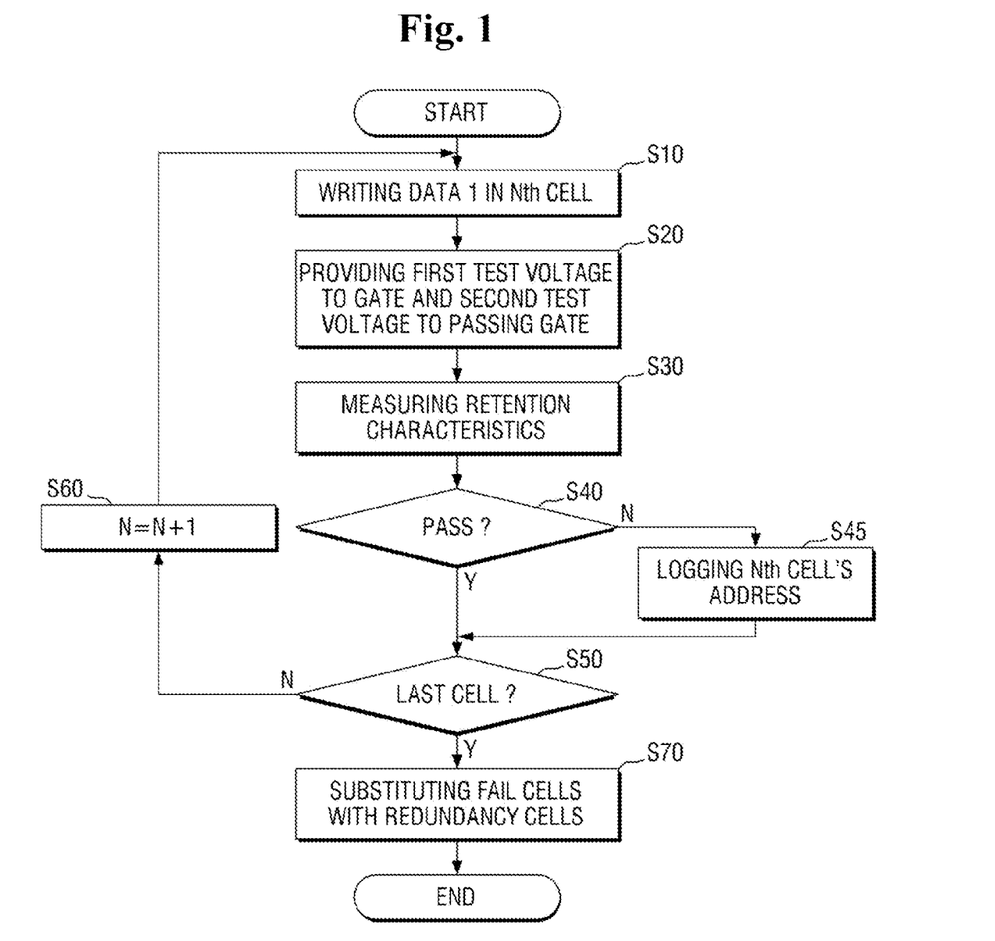
FIG. 1 is a flowchart illustrating a test method of a semiconductor device according to some example embodiments of inventive concepts.
Figure 2:
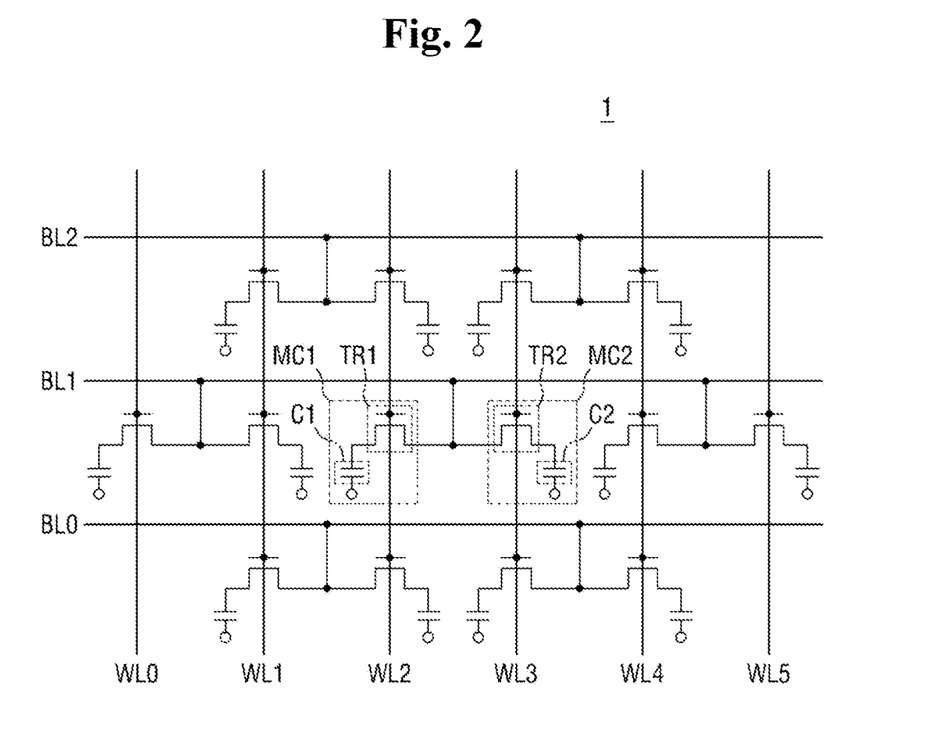
FIG. 2 is a circuit view of a semiconductor device to which the test method illustrated in FIG. 1 can be applied.
Figure 3:
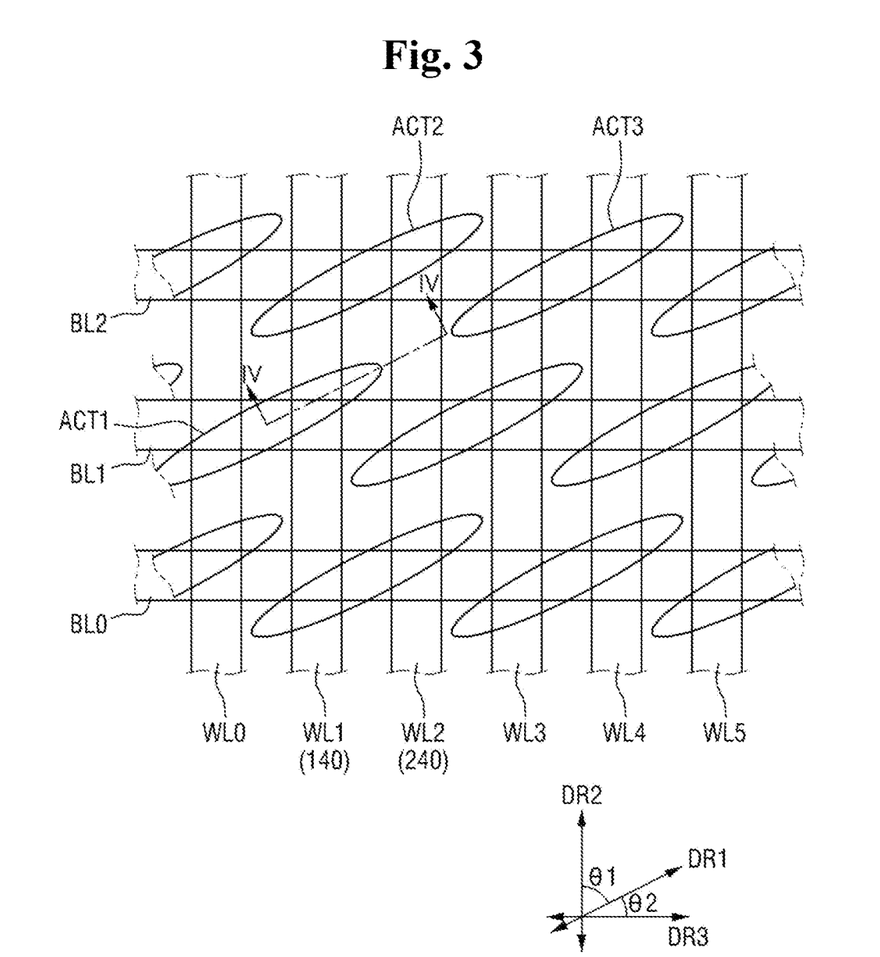
FIG. 3 is a layout view of the semiconductor device shown in FIG. 2.
Figure 4:
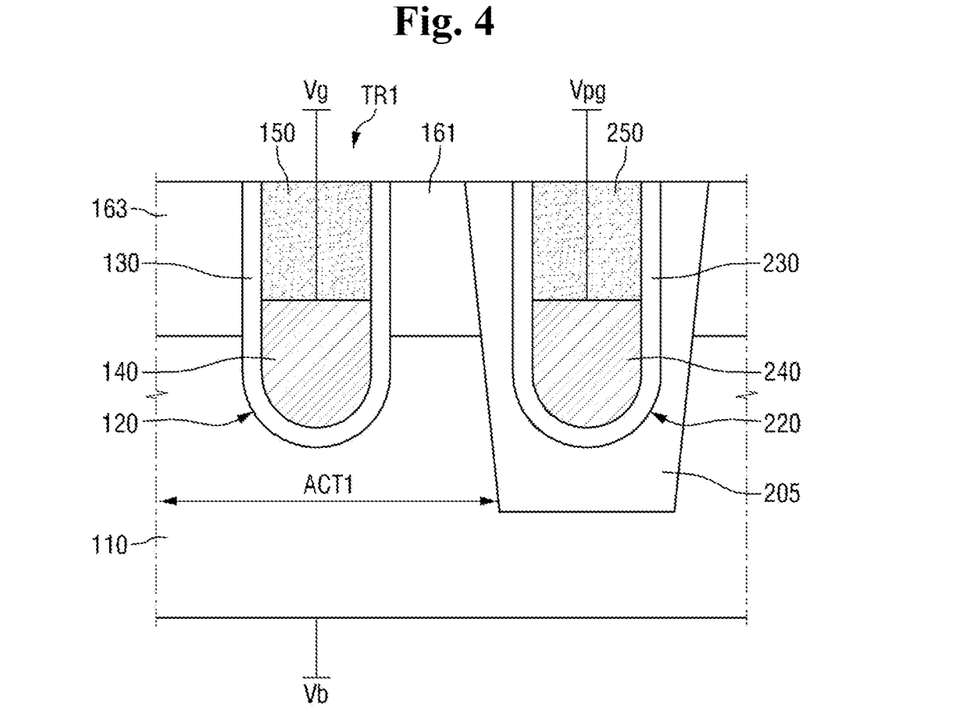
FIG. 4 is a cross-sectional view taken along the line IV-IV of FIG. 3.
Figure 5:
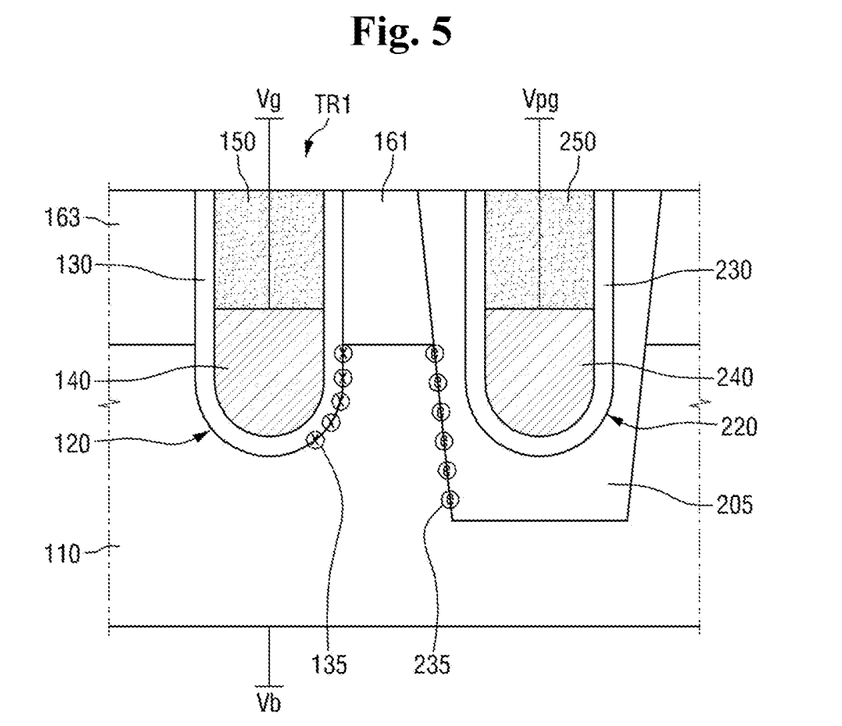
FIG. 5 is a cross-sectional view illustrating the test method illustrated in FIG. 1.

FIG. 1 is a flowchart illustrating a test method of a semiconductor device according to some example embodiments of inventive concepts, FIG. 2 is a circuit view of a semiconductor device to which the test method illustrated in FIG. 1 can be applied, FIG. 3 is a layout view of the semiconductor device shown in FIG. 2, FIG. 4 is a cross-sectional view taken along the line IV-IV of FIG. 3, and FIG. 5 is a cross-sectional view illustrating the test method illustrated in FIG. 1.

The semiconductor device 1 to be tested will be described with reference to FIGS. 2 to 4. The semiconductor device 1 may be a dynamic random access memory (DRAM), but example embodiments are not limited thereto.

As shown in FIG. 2, the semiconductor device 1 includes a plurality of word lines (e.g., WL0 to WL5) and a plurality of bit lines (e.g., BL0 to BL2). The semiconductor device 1 also includes memory cells (e.g., MC1 and MC2) electrically connected to the word lines WL0 to WL5 and the bit lines BL0 to BL2. Each of the memory cells MC1 and MC2 may include capacitors C1 and C2 storing charges, and access transistors TR1 and TR2 controlling access to the capacitors C1 and C2. As shown in FIG. 2, a source of the access transistor TR1 and a source of the access transistor TR2 may be shared.

As shown in FIGS. 3 and 4, unit active regions (e.g., ACT1 to ACT3) are defined by forming an isolation region 205 in a substrate 110. For example, the unit active regions ACT1 to ACT3 may extend in a first direction DR1, the word lines WL0 to WL5 may extend in a second direction DR2 forming an acute angle with respect to the first direction DR1, and the bit lines BL0 to BL2 may extend in a third direction DR3 forming an acute angle with respect to the first direction DR1. The layout shown in FIG. 3 may be a 6F2 cell structure layout.

Here, when it is said that "a particular direction and another particular direction form an angle," the term "angle" used herein means a smaller angle of two angles formed by two directions crossing each other, for example, 60° when angles formed by two directions cross each other are 120° and 60°. Thus, as shown in FIG. 3, the angle formed by the first direction DR1 and the second direction DR2 is θ1, and the angle formed by the first direction DR1 and the third direction DR3 is θ2.

As described above, the reason for θ1 and/or θ2 being acute angles is to obtain a maximum distance between a bit line contact connecting the unit active regions ACT1 to ACT3 and the bit lines BL0 to BL2 and a storage node contact connecting the unit active regions ACT1 to ACT3 and a capacitor (not shown). For example, θ1 and θ2 may be 45° and 45°, 30° and 60° or 60° and 30°, but example embodiments are not limited thereto.

One of two word lines (e.g., WL1 and WL2), (i.e., a gate 140 or 240) may be formed to cross one unit active region (e.g., ACT2). Accordingly, two access transistors may be formed in the unit active region (e.g., ACT2).

As shown in FIG. 3, the unit active regions ACT1 to ACT3 are spaced apart from each other. In addition, the plurality of word lines WL0 to WL5 and the plurality of bit lines BL0 to BL2 are arranged to cross each other. Therefore, the word line WL2 crossing another unit active region ACT2 may be disposed around the one unit active region ACT1. In relation to the unit active region ACT1, the word line WL2 passing the unit active region ACT1 in proximity to the unit active region ACT1 is called a passing gate 240. In the layout shown in FIG. 3, one passing gate is positioned between the neighboring unit active regions ACT1 and ACT3.

As shown in FIG. 4, a gate insulation layer 130 may be formed along sidewalls and a bottom surface of a first trench 120 formed in the substrate 110. The gate insulation layer 130 may not be formed on a top surface of the substrate 110. The gate 140 may be formed in the first trench 120 so as to fill a portion of the first trench 120 without completely filling the first trench 120. For example, the gate 140 may be in a recessed form. The gate 140 may be made of a conductive material such as a metal or polysilicon. A capping layer 150 may be formed on the gate 140 to fill the first trench 120.

Junction regions 161 and 163 serving as source/drain may be formed on both sides of the gate 130. Although not shown, a bit line contact may be formed on the junction region 163, and a storage node contact may be formed on the junction region 161.

The passing gate 240 may be disposed in the isolation region 205. For example, the gate insulation layer 230 may be formed along sidewalls and a bottom surface of a second trench 220 formed in the substrate 110. The gate insulation layer 230 may not be formed on the top surface of the substrate 110. The passing gate 240 may be formed in the second trench 220 so as to fill a portion of the second trench 220 without completely filling the second trench 220. For example, the passing gate 240 may be in a recessed form. The passing gate 240 may be made of a conductive material such as a metal or polysilicon. A capping layer 250 may be formed on the passing gate 240 to fill the second trench 220.

Referring to FIGS. 1, 4 and 5, data 1 is written in a target volatile device cell (e.g., an Nth cell, where n is a natural number) (S10). Here, the data 1 may mean that charges are stored in a capacitor of the volatile device cell.

Next, a first test voltage Vg is provided to a gate 130 and a second test voltage Vpg is provided to a passing gate 230 (S20). For example, an interface of the gate insulation layer 130 is deteriorated using the first test voltage Vg and the second test voltage Vpg. That is to say, defects 135 existing at the interface of the gate insulation layer 130 are activated.

The first test voltage Vg may be a negative voltage. The second test voltage Vpg may also be a negative voltage. If the first test voltage Vg is a negative voltage, the access transistor TR1 is in an off state. In this case, leakage current occurs rapidly and a time required for measuring retention characteristics (S30) may be reduced. Since a drain voltage (Vd) is reduced over time due to the leakage current, the first test voltage Vg is reduced accordingly.

The absolute value of the first test voltage Vg may be greater than that of the second test voltage Vpg. The first test voltage Vg and the second test voltage Vpg may be controlled independently of each other. The absolute value of the first test voltage Vg may be greater than that of the second test voltage Vpg to allow electric fields to be concentrated on a gate and to induce electrons to be trapped.

For example, the first test voltage Vg may be −3.8 V and the second test voltage Vpg may be −1.3 V.

The test method of the semiconductor device according to an example embodiment of inventive concepts may further include providing a third test voltage Vb greater than the first test voltage Vg to the substrate 110. A value of the third test voltage Vb may be the same as a value of the second test voltage Vpg. For example, the third test voltage Vb may be −1.3 V.

If the third test voltage Vb and the second test voltage Vpg have the same value, unnecessary electric fields are not generated under the passing gate 240. Therefore, more accurate characteristics can be measured.

Meanwhile, a variable retention time (VRT) cell may have defects 135 existing at the interface of the gate insulation layer 130. If the CRT cell has defects, leakage current may occur by trap assisted tunneling (TAT). For example, the volatile device cell having defects 135 at the interface of the gate insulation layer 130 may have a short retention time tRET. However, even if there are interfacial defects 135, the defects 135 may be deactivated by bonding with, for example, H atoms. Thus, the VRT cell having deactivated interfacial defects 135 may maintain a normal retention time tRET. However, if the H atoms bonded with the defects 135 become separated from the defects 135, the VRT cell may have a short retention time tRET. Therefore, the VRT cell may not have a constant retention time tRET.

In addition, if the first test voltage Vg and the second test voltage Vpg are provided, electrons may be trapped at an interface of the isolation region 205. The electrons trapped in the isolation region 205 may also increase leakage current.

In the test method of a semiconductor device according to some example embodiments of inventive concepts, the first test voltage Vg and the second test voltage Vpg are provided, thereby intentionally separating the H atoms from the defects 135 to activate the interfacial defects 135. In addition, electrons may also be intentionally trapped into the isolation region 205.

The normal volatile device cell may maintain a long retention time tRET even if the first test voltage Vg and the second test voltage Vpg are provided. However, the VRT cell may have activated interfacial defects 135 by the first test voltage Vg and the second test voltage Vpg and trapped electrons in the isolation region 205. Therefore, the VRT cell may have increased leakage current.

Next, retention characteristics are measured (S30).

The retention characteristics may be measured by measuring the retention time tRET of the volatile device cell, but example embodiments are not limited thereto. For example, the retention characteristics may be measured by measuring the leakage current of the volatile device cell.

Step S40 determines whether the measured retention characteristics pass predefined standards or not.

For example, it is determined whether the measured retention time tRET is longer than a preset reference time. If the retention time tRET is longer than the preset reference time, it is determined that the tested cell is a pass cell, and if the retention time tRET is shorter than the preset reference time, the tested cell is determined to be a fail cell.

In a case of a fail result, an address of the target volatile device cell (e.g., an Nth cell's address) is logged (S45), which is for the purpose of substituting fail cells with redundancy cells after the test is completed.

In a case of a pass result, it is checked whether the target volatile device cell is the last cell or not (S50).

If not, n is incremented by 1 so that n=n+1 (S60). Thus, retention characteristics of a next cell (i.e., (n+1)th cell) are measured.

In a case where the target volatile device cell is the last cell, fail cells are substituted with redundancy cells (S70).

In the test method of the semiconductor device according to some example embodiments of inventive concepts, the measuring of the retention characteristics (S30) may be performed only once for a pertinent volatile device cell.

As described above, the interfacial defects 135 of a VRT cell are activated by the first test voltage Vg and the second test voltage Vpg. Therefore, it is determined whether the pertinent volatile device cell is a VRT cell without having to measure the retention characteristics thereof.

In the test method of the semiconductor device according to some example embodiments of inventive concepts, since interfacial defects are intentionally activated, the retention characteristics of a volatile device cell may be measured just one time. Therefore, the VRT cell can be accurately tested within a short time.

In addition, in the test method of the semiconductor device according to some example embodiments of inventive concepts, the test is performed by providing the first test voltage Vg to one among the plurality of word lines WL0 to WL5 and providing the second test voltage Vpg to an immediately next word line among the plurality of word lines WL0 to WL5. Thus, one or more retention characteristics of the volatile device cell connected to a target word line to be tested (i.e., one of WL0 to WL5) may be simultaneously measured.

In addition, the first test voltage Vg may be provided to the plurality of word lines WL0 to WL5 and the second test voltage Vpg may be provided to immediately next ones among the plurality of word lines WL0 to WL5. Therefore, retention characteristics of multiple volatile device cells connected to target plurality of word lines WL0 to WL5 to be tested may be simultaneously measured.

Figure 6:
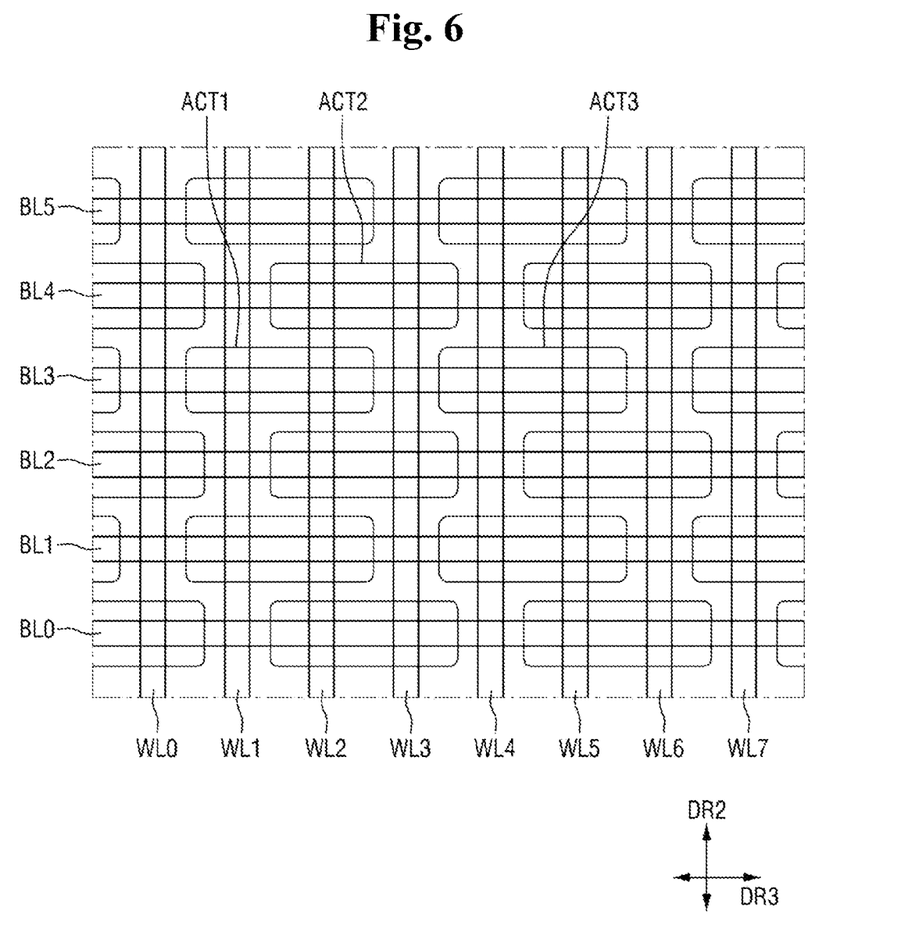
FIG. 6 is a layout view of an example semiconductor device to which a test method of the semiconductor device according to some example embodiments of inventive concepts can be applied.

FIG. 6 is a layout view of an example semiconductor device to which a test method of the semiconductor device according to some example embodiments of inventive concepts can be applied. For brevity, the following description will focus on differences between the illustrated semiconductor device and the semiconductor device shown in FIG. 3.

Referring to FIG. 6, the semiconductor device includes a plurality of unit active regions (e.g., ACT1 to ACT3), a plurality of word lines (e.g., WL0 to WL7), and a plurality of bit lines (e.g., BL0 to BL5).

The unit active regions ACT1 to ACT3 may extend in a third direction DR3, the word lines WL0 to WL7 may extend in a second direction DR2, and the bit lines BL0 to BL2 may extend in a third direction DR3. The layout shown in FIG. 6 may be a layout of a 6F2 cell structure.

One word line (e.g., WL3) crossing another unit active region (e.g., ACT2) may be disposed in the vicinity of one unit active region (e.g., ACT1). In relation to the unit active region ACT1, the word line WL3 passing the unit active region ACT1 in proximity to the unit active region ACT1 is a passing gate. In the layout shown in FIG. 6, one passing gate is positioned between the neighboring unit active regions ACT1 and ACT3.

Therefore, in order to measure retention characteristics of a volatile device cell formed in a unit active region (e.g., ACT1), a first test voltage Vg is provided to a word line (e.g., WL2) and a second test voltage Vpg is provided to another word line (e.g., WL3).

Figure 7:
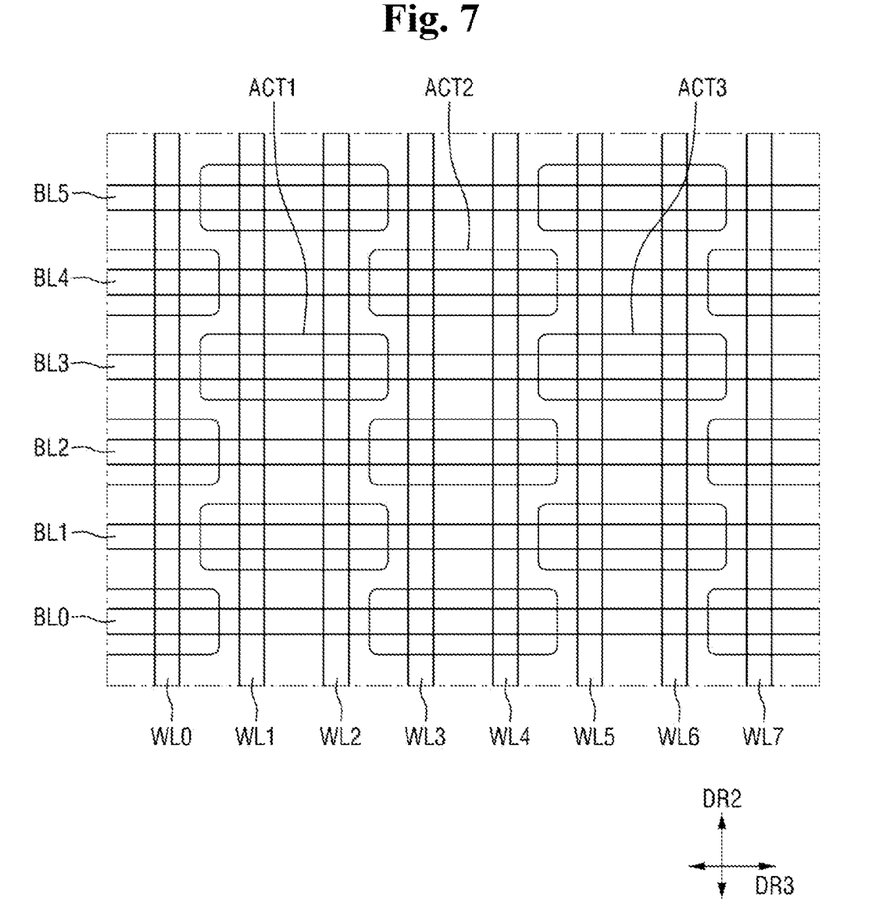
FIG. 7 is a layout view of another example semiconductor device to which a test method of the semiconductor device according to some example embodiments inventive concepts can be applied.

FIG. 7 is a layout view of another example semiconductor device to which a test method of the semiconductor device according to some example embodiments of inventive concepts can be applied. For brevity, the following description will focus on differences between the illustrated semiconductor device and the semiconductor device shown in FIG. 3.

Referring to FIG. 7, the semiconductor device may include a plurality of unit active regions (e.g., ACT1 to ACT3), a plurality of word lines (e.g., WL0 to WL7) and a plurality of bit lines (e.g., BL0 to BL5).

The unit active regions ACT1 to ACT3 may extend in a third direction DR3. The word lines WL0 to WL7 may extend in a second direction DR2, and the bit lines BL0 to BL2 may also extend in the third direction DR3. The layout shown in FIG. 7 may be a layout of an 8F2 cell structure.

Word lines (e.g., WL3 and WL4) crossing another unit active region (e.g., ACT2) may be disposed in the vicinity of one unit active region (e.g., ACT1). In relation to the unit active region ACT1, the word lines WL3 and WL4 passing the unit active region ACT1 in proximity to the unit active region ACT1 are passing gates. In the layout shown in FIG. 7, two passing gates are positioned between the neighboring unit active regions ACT1 and ACT3.

Therefore, in order to measure retention characteristics of a volatile device cell formed in a unit active region (e.g., ACT1), a first test voltage Vg is provided to a word line (e.g., WL2) and a second test voltage Vpg is provided to another word line (e.g., WL3).

Figure 8:
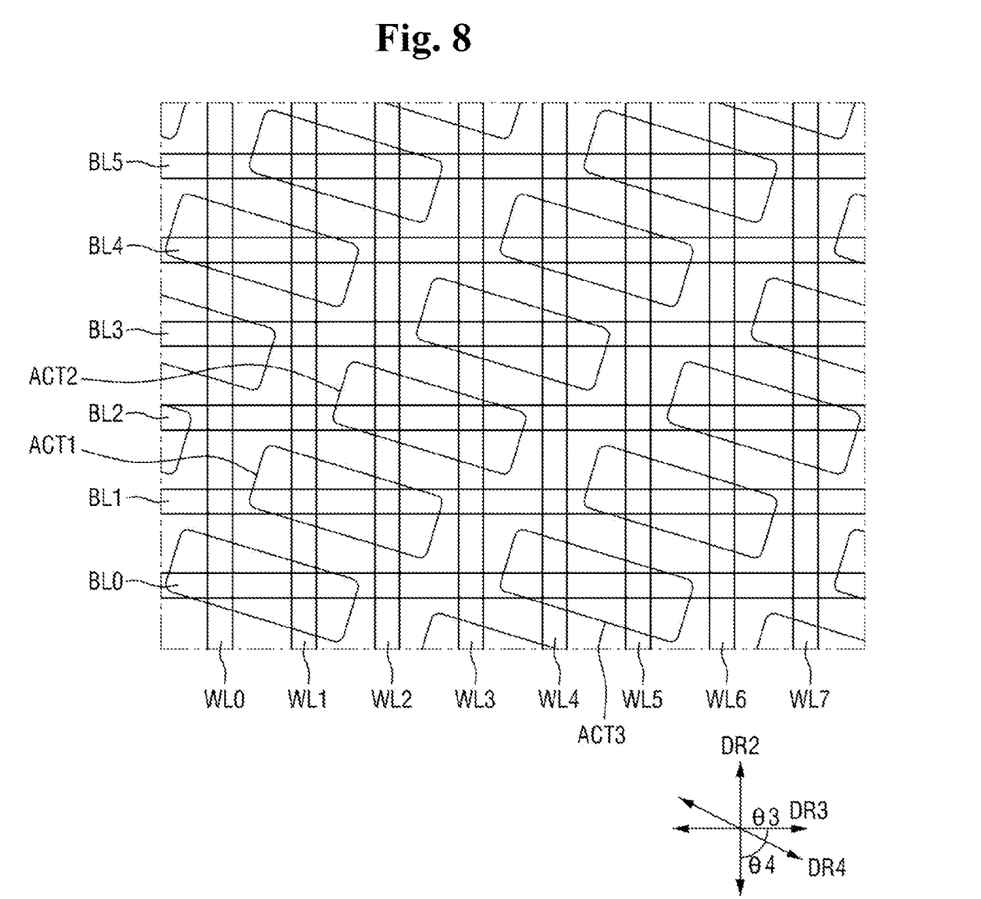
FIG. 8 is a layout view of still another example semiconductor device to which a test method of the semiconductor device according to some example embodiments of inventive concepts can be applied.

FIG. 8 is a layout view of still another example semiconductor device to which a test method of the semiconductor device according to some example embodiments of inventive concepts can be applied. For brevity, the following description will focus on differences between the illustrated semiconductor device and the semiconductor device shown in FIG. 3.

Referring to FIG. 8, the semiconductor device may include a plurality of unit active regions (e.g., ACT1 to ACT3), a plurality of word lines (e.g., WL0 to WL7) and a plurality of bit lines (e.g., BL0 to BL5).

The unit active regions ACT1 to ACT3 may extend in a fourth direction DR4. The word lines WL0 to WL7 may extend in a second direction DR2 forming an acute angle θ4 with respect to the fourth direction DR4, and the bit lines BL0 to BL2 may extend in a third direction DR3 forming an acute angle θ3 with respect to the fourth direction DR4. The layout shown in FIG. 8 may be a layout of an 8F2 cell structure.

One word line (e.g., WL3) crossing another unit active region (e.g., ACT2) may be disposed in the vicinity of one unit active region (e.g., ACT1). In relation to the unit active region ACT1, the word line WL3 passing the unit active region ACT1 in proximity to the unit active region ACT1 is a passing gate. In the layout shown in FIG. 8, one passing gate is positioned between the neighboring unit active regions ACT1 and ACT3.

Therefore, in order to measure retention characteristics of a volatile device cell formed in a unit active region (e.g., ACT1), a first test voltage Vg is provided to a word line (e.g., WL2) and a second test voltage Vpg is provided to another word line (e.g., WL3).

Figure 9:
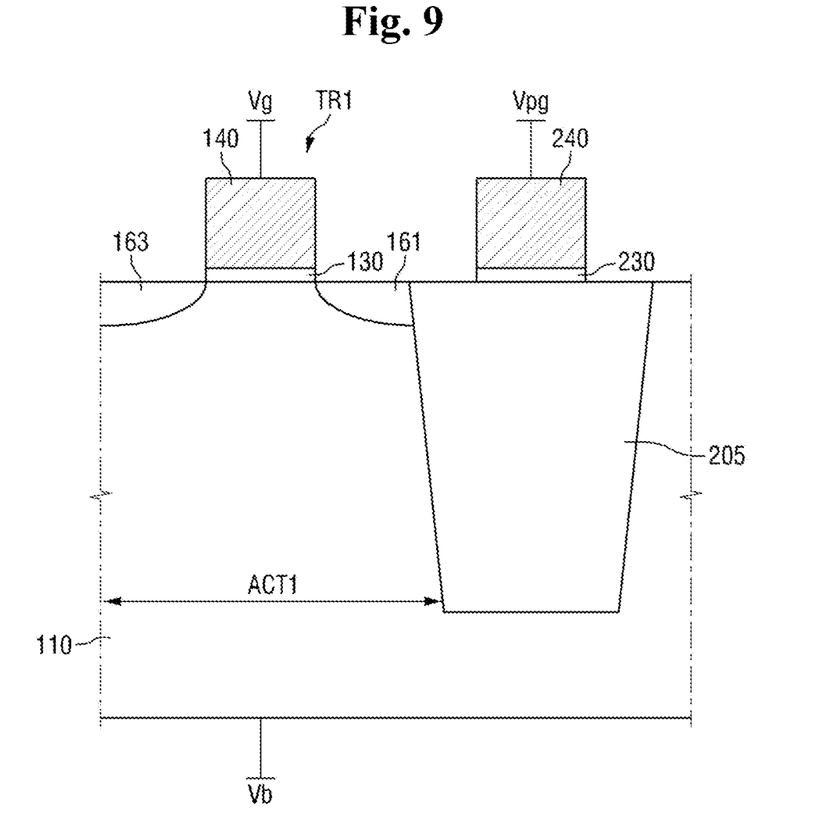
FIG. 9 is a layout view of a semiconductor device according to some example embodiments to which a test method of the semiconductor device according to some example embodiments can be applied.

FIG. 9 is a layout view of still another example semiconductor device to which a test method of the semiconductor device according to some example embodiments of inventive concepts can be applied. For brevity, the following description will focus on differences between the illustrated semiconductor device and the semiconductor device shown in FIG. 4.

Referring to FIG. 9, the semiconductor device may employ a planar-type access transistor TR1. For example, the access transistor TR1 may include a gate insulation layer 130 and a gate 140 formed on a substrate 110, and junction regions 161 and 163 formed in the substrate 110 around the gate 140. A gate insulation layer 230 and a passing gate 240 may be formed on an isolation region 205. In order to measure retention characteristics of a volatile device cell formed in a unit active region ACT1, a first test voltage Vg is provided to the gate 140 and a second test voltage Vpg is provided to the passing gate 240.

Figure 10:
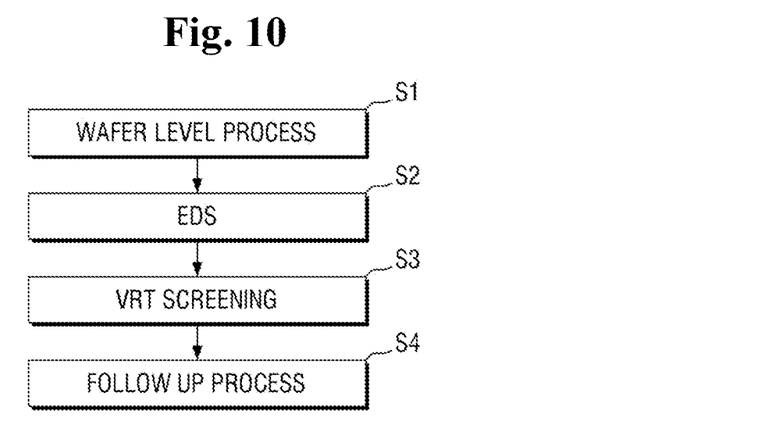
FIGS. 10 to 12 are flowcharts for explaining a test method of a semiconductor device according to some example embodiments of inventive concepts.
Figure 11:
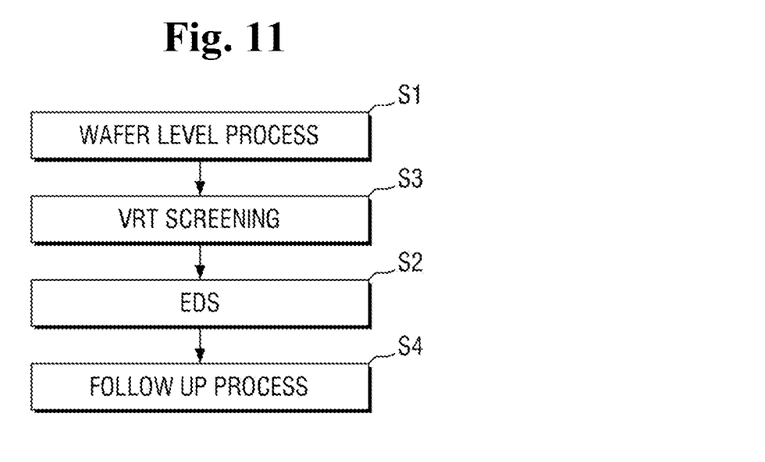
Figure 12:
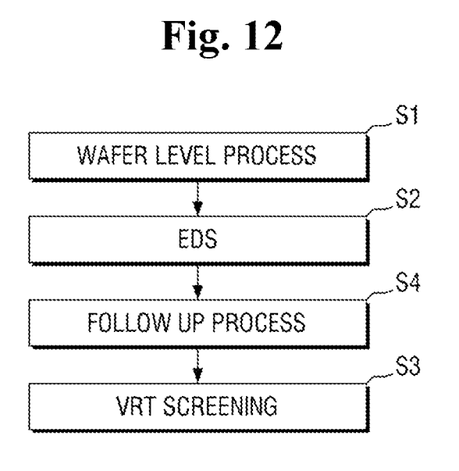

FIGS. 10 to 12 are flowcharts for explaining a test method of a semiconductor device according to some example embodiments of inventive concepts.

Referring to FIG. 10, a wafer level process for manufacturing, for example, the semiconductor device 1, is performed (S1). For example, the wafer level process may include diffusion, photolithography, etching, ion implantation, metal wiring, and so on. In such a manner a plurality of IC chips are formed on a wafer.

Next, an electric die sorting (EDS) test is performed (S2). In the EDS test, electrical failures of the IC chips formed on the wafer are tested.

Next, the retention characteristics of the VRT cells described above with reference to FIGS. 1 to 9 are screened (S3). For example, data 1 is written in a target volatile device cell and electrical stress is then applied to the target volatile device cell using test voltages to measure the retention characteristics.

Next, a follow up process is performed (S4). The follow up process may include, for example, wafer dicing, packaging, and so on, but example embodiments are not limited thereto.

Referring to FIG. 11, before performing the EDS test (S2), the VRT screening may first be performed (S3). In this case, the number of target volatile device cells may be increased.

Referring to FIG. 12, the VRT screening may be performed after performing the follow up process (S4).

The sequence of the process steps of the test method shown in FIGS. 10 to 12 is provided only for illustration, but example embodiments are not limited thereto. For example, the VRT screening (S3) may be performed in any step of the manufacturing process.

Figure 13:
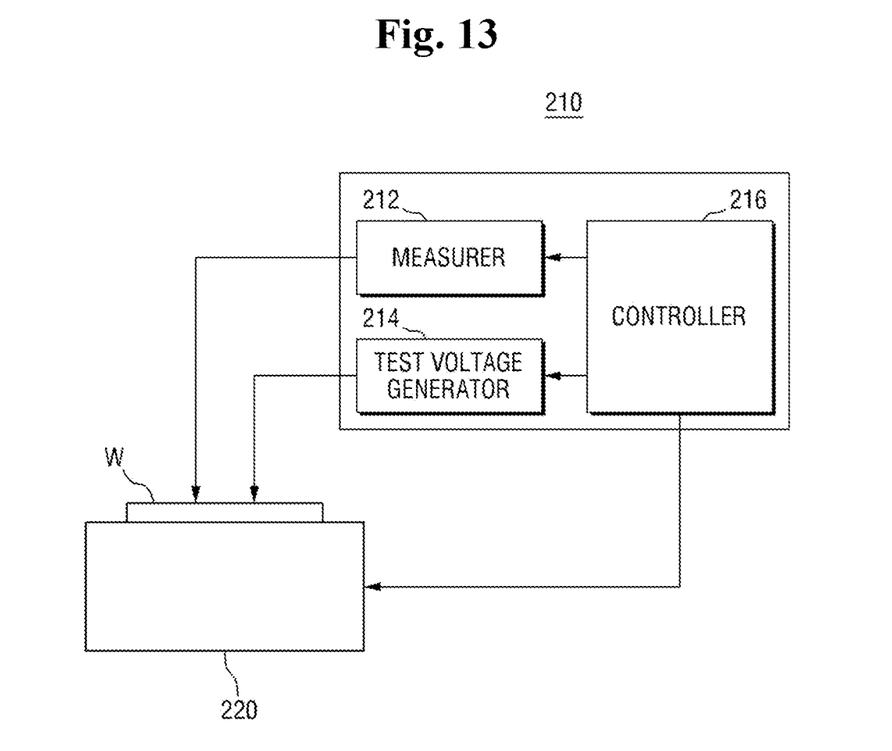
FIG. 13 is a block diagram of a semiconductor test apparatus according to some example embodiments inventive concepts.

FIG. 13 is a block diagram of a semiconductor test apparatus according to some example embodiments of inventive concepts.

Referring to FIG. 13, the semiconductor test apparatus 210 according to some example embodiments of inventive concepts may include a support 220, a test voltage generator 214, a measurer 212, and a controller 216.

A to-be-tested semiconductor device W is mounted on the support 220. The to-be-tested semiconductor device W may be one of devices described above with reference to FIGS. 1 to 9. For example, the semiconductor device W may include a substrate having an active region and an isolation region, a gate insulation layer and a gate formed in the active region, a junction region formed in the active region, a volatile device cell including a capacitor connected to the junction region, and a passing gate formed in the isolation region.

The test voltage generator 214 provides a first test voltage Vg to the gate and a second test voltage Vpg greater than the first test voltage Vg to the passing gate to deteriorate interfacial defects of the gate insulation layer 130.

The first test voltage Vg may be a negative voltage. The second test voltage Vpg may also be a negative voltage. The absolute value of the first test voltage Vg may be greater than the absolute value of the second test voltage Vpg. For example, the first test voltage Vg may be −3.8 V and the second test voltage Vpg may be −1.3 V. In addition, the test voltage generator 214 may further provide a third test voltage Vb greater than the first test voltage Vg to the substrate. A level of the third test voltage Vb may be the same as a level of the second test voltage Vpg. For example, the third test voltage Vb may be −1.3 V, which is greater than −3.8 V.

The semiconductor test apparatus according to some example embodiments of inventive concepts provides the first test voltage Vg and the second test voltage Vpg, thereby intentionally separating H atoms away from the defects to activate the interfacial defects. In addition, electrons are intentionally trapped into the isolation region.

The measurer 212 measures retention characteristics of the volatile device cell. For example, a retention time tRET of the volatile device cell may be measured to measure the retention characteristics, but example embodiments are not limited thereto. For example, leakage current of the volatile device cell may be measured to measure the retention characteristics.

The controller 216 determines whether the measured retention characteristics pass predefined standards or not.

For example, the controller 216 determines whether the measured retention time tRET is longer than a preset reference time. If the retention time tRET is longer than the preset reference time, it is determined that the tested cell is a pass cell, and if the retention time tRET is shorter than the preset reference time, the tested cell is determined to be a fail cell.

While example embodiments of inventive concepts have been particularly shown and described with reference to some example embodiments thereof, it will be understood by those of ordinary skill in the art that various changes in form and details may be made therein without departing from the spirit and scope of the present inventive concept as defined by the following claims. It is therefore desired that the present example embodiments be considered in all respects as illustrative and not restrictive, reference being made to the appended claims rather than the foregoing description to indicate the scope of example embodiments of inventive concepts.

What is claimed is:

1. A test method of a semiconductor device, the test method comprising:
providing a semiconductor device having a substrate including an active region and an isolation region, a volatile device cell including a gate insulation layer and a first gate on the active region, a junction region in the active region, and a capacitor connected to the junction region, and a passing gate on the isolation region;
performing an electronic die sorting (EDS) test on the semiconductor device;
providing a first test voltage to the first gate and a second test voltage greater than the first test voltage to the passing gate;
measuring retention characteristics of the volatile device cell; and
performing a packaging process on the semiconductor device after the measuring.

2. The test method of claim 1, wherein the first test voltage is a negative voltage.

3. The test method of claim 2, wherein the second test voltage is a negative voltage.

4. The test method of claim 2, wherein the absolute value of the first test voltage is greater than the absolute value of the second test voltage.

5. The test method of claim 1, wherein the measuring includes measuring a data retention time (tRET) of the volatile device cell.

6. The test method of claim 1, wherein the measuring includes measuring a leakage current of the volatile device cell.

7. The test method of claim 1, wherein the measuring is performed once for each volatile device cell.

8. The test method of claim 1, further comprising:
writing data 1 to the volatile device cell prior to providing the first test voltage and the second test voltage.

9. The test method of claim 1, further comprising:
providing a third test voltage greater than the first test voltage to the substrate.

10. The test method of claim 9, wherein a level of the third test voltage is the same as that of the second test voltage.

11. The test method of claim 1, wherein the volatile device cell is one of a DRAM and an SRAM cell.

12. A test method of a semiconductor device, the test method comprising:
providing a semiconductor device including a plurality of word lines, each connected to one or more volatile device cell;
providing a first test voltage to a first word line among the plurality of word lines and providing a second test voltage greater than the first test voltage to a second word line among the plurality of word lines, the second word line being directly next to the first word line;
measuring one or more retention characteristics of the volatile device cell connected to the first word line; and
performing an electronic die sorting (EDS) test on the semiconductor device after the measuring.

13. The test method of claim 12, wherein the first test voltage is a negative voltage.

14. The test method of claim 13, wherein the second test voltage is a negative voltage.

15. The test method of claim 13, wherein the absolute value of the first test voltage is greater than the absolute value of the second test voltage.

16. The test method of claim 12, wherein the measuring includes measuring a data retention time (tRET) of the volatile device cell.

17. The test method of claim 12, wherein the measuring includes measuring a leakage current of the volatile device cell.

18. The test method of claim 12, wherein the providing the first test voltage includes providing the first test voltage to a plurality of first word lines among the plurality of word lines and providing the second test voltage to a plurality of second word lines among the plurality of word lines, and the measuring includes measuring a plurality of retention characteristics of the volatile device cell connected to the plurality of first word lines.

19. The test method of claim 12, wherein the volatile device cell is one of a DRAM and an SRAM cell.

20. The test method of claim 12, further comprising: performing a packaging process after the measuring.

21. A semiconductor test apparatus comprising:
   a support configured to hold a semiconductor device having a substrate including an active region and an isolation region, a volatile device cell including a gate insulation layer and a first gate in the active region, a junction region in the active region, a capacitor connected to the junction region, and a passing gate in the isolation region;
   a test voltage generator configured to provide a first test voltage to the first gate and a second test voltage greater than the first test voltage to the passing gate;
   an electric die sorter configured to test electrical failures of semiconductor chips on the semiconductor device; and
   a measurer configured to measure retention characteristics of the volatile device cell.

22. The semiconductor test apparatus of claim 21, wherein the first test voltage is a negative voltage.

23. A test method of a semiconductor device, the test method comprising:
   applying a first voltage to a first gate of a volatile device cell,
      the volatile device cell in an active region of a substrate in the semiconductor device and including a gate insulation layer and the first gate,
      the substrate including the active region and an isolation region, a junction region on the active region and a capacitor connected to the junction region;
   applying a second voltage to a passing gate in the isolation region of the substrate, the first voltage being less than the second voltage; and
   measuring retention characteristics of the volatile device cell; and
   performing an electronic die sorting (EDS) test on the semiconductor device after the measuring.

24. The test method of claim 23, wherein the first voltage and the second voltage deteriorate the retention characteristics of the volatile device cell.

25. The test method of claim 23, wherein the measuring includes measuring a data retention time (tRET) of the volatile device cell.

26. The test method of claim 23, wherein the first voltage and the second voltage are applied simultaneously.

* * * * *